(12) United States Patent
Imahama et al.

(10) Patent No.: US 11,792,574 B2
(45) Date of Patent: Oct. 17, 2023

(54) AV AMPLIFIER

(71) Applicant: D&M Holdings, Inc., Kanagawa (JP)

(72) Inventors: Yoshiharu Imahama, Fukushima (JP); Shunichi Tani, Fukushima (JP)

(73) Assignee: D&M Holdings Inc.

( * ) Notice: Subject to any disclaimer, the term of this patent is extended or adjusted under 35 U.S.C. 154(b) by 0 days.

(21) Appl. No.: 17/904,971

(22) PCT Filed: Sep. 29, 2020

(86) PCT No.: PCT/JP2020/036885
§ 371 (c)(1),
(2) Date: Aug. 25, 2022

(87) PCT Pub. No.: WO2021/171674
PCT Pub. Date: Sep. 2, 2021

(65) Prior Publication Data
US 2023/0093582 A1   Mar. 23, 2023

(30) Foreign Application Priority Data

Feb. 27, 2020 (JP) ................. 2020-031291

(51) Int. Cl.
*G06F 3/16* (2006.01)
*H04R 5/04* (2006.01)
(Continued)

(52) U.S. Cl.
CPC ............... *H04R 5/04* (2013.01); *H03F 1/00* (2013.01); *H04R 3/12* (2013.01); *H04S 7/00* (2013.01); *G06F 3/165* (2013.01); *H03F 2200/03* (2013.01)

(58) Field of Classification Search
CPC .... H04R 5/04; H04R 3/12; H03F 1/00; H03F 2200/03; H04S 7/00; G06F 3/165
See application file for complete search history.

(56) References Cited

U.S. PATENT DOCUMENTS

| 10,231,074 B2 * | 3/2019 | Baalu ................ H04L 47/70 |
| 2004/0190726 A1 * | 9/2004 | Imadate ............. H04R 5/04 |
| | | 381/11 |

(Continued)

FOREIGN PATENT DOCUMENTS

| JP | 2002367290 | 12/2002 |
| JP | 2007104159 | 4/2007 |
| WO | 2014103627 | 7/2014 |

OTHER PUBLICATIONS

English translation of International Search Report and Written Opinion for PCT/JP20201036885, dated Nov. 11, 2020.

*Primary Examiner* — Joseph Saunders, Jr.
(74) *Attorney, Agent, or Firm* — Peter A. Nieves; Nieves IP Law Group, LLC

(57) ABSTRACT

An AV amplifier contains an input unit to input digital data and an operation unit that receives a reproduction instruction. A switching unit switches whether to output the digital data input to a server interface unit or DSP in response to the reproduction instruction. The DSP processes the digital data output to obtain and output a two-channel signal, which the server interface unit transmits by the switching unit to a server and receives an audio signal from the server. An audio reproduction unit reproduces the server interface unit received audio signal and an audio signal output by the DSP. An output unit outputs the reproduced audio signal to each speaker and a control unit controls the switching unit and the server interface unit in response to the reproduction instruction from the user. The control unit controls the switching unit, when two-channel audio reproduction is instructed from the user.

12 Claims, 5 Drawing Sheets

(51) Int. Cl.
*H03F 1/00* (2006.01)
*H04R 3/12* (2006.01)
*H04S 7/00* (2006.01)

(56) References Cited

U.S. PATENT DOCUMENTS

| | | | | |
|---|---|---|---|---|
| 2009/0292377 | A1* | 11/2009 | Yamasaki | H04S 3/02 |
| | | | | 700/94 |
| 2015/0319550 | A1* | 11/2015 | Fujita | H04S 7/302 |
| | | | | 381/303 |
| 2018/0098151 | A1* | 4/2018 | Penke | H04R 3/12 |
| 2019/0075398 | A1* | 3/2019 | Shirai | H04R 3/12 |

* cited by examiner

AV AMPLIFIER

CROSS-REFERENCE TO RELATED APPLICATIONS

This application is the national stage of International Application No. PCT/JP2020/036885, filed Sep. 29, 2020, entitled AV AMPLIFIER which claims the benefit of Japanese Patent Application serial number 2020-031291, filed Feb. 27, 2020, both of which are incorporated by reference herein in their entirety.

TECHNICAL FIELD

The present invention relates to an AV amplifier that outputs a two-channel or multi-channel audio signal.

BACKGROUND ART

In recent years, in addition to a related-art AV amplifier that outputs two-channel stereo audio, there is known such an AV amplifier as to be connected to a player for reproducing a multi-channel digital sound signal recorded on a recording medium such as a digital versatile disc (DVD) and to amplify a multi-channel digital signal output from the player for each channel (see, for example, Patent Literature 1).

As the above-mentioned multi-channel digital signal, in general, a digital sound signal for 5.1 channels formed of a front left channel (hereinafter referred to as "L channel"), a center channel (hereinafter referred to as "C channel"), a front right channel (hereinafter referred to as "R channel"), a surround left channel (hereinafter referred to as "LS channel"), a surround right channel (hereinafter referred to as "RS channel"), and a channel for a subwoofer (hereinafter referred to as "SW channel") is widely known. A user can enjoy a surround audio signal which is output from the AV amplifier for amplifying such a multi-channel digital signal for each channel, and sounds of which are emitted from a plurality of speakers.

CITATION LIST

Patent Literature

[PTL 1] JP 2002-367290 A

SUMMARY OF INVENTION

Technical Problem

Such an AV amplifier supporting a multi-channel digital signal as described above is required to be provided with a demand-side platform (DSP) for generating a digital signal output from a player for a plurality of channels, and therefore tends to have a more complicated configuration in a device than that of a normal amplifier that handles only two channels of an L channel and an R channel. In addition, in recent years, a digital audio signal for 7.1 channels obtained by adding a surround back left channel and a surround back right channel to the above-mentioned 5.1 channels has become widely known. For home audio for home use, there are also known, for example, Auro-3D (trademark), which supports a maximum of 13.1 channels, and Dolby Atoms (trademark) for Home, which supports a maximum of 24.1.10 channels. Thus, the number of channels of audio channels tends to increase more and more.

Under a situation in which the number of channels of audio channels tends to increase more and more as described above, not only a burden on the DSP for processing the digital signal output from the player increases more and more, but also an AV amplifier provided with a DSP that supports the number of newly added channels is required, and hence a user is required to replace the owned AV amplifier by purchasing an AV amplifier that supports the number of new channels.

However, an AV amplifier having a large number of supported channels is generally expensive. Therefore, it increases a financial burden on the user to replace an AV amplifier by purchasing a new one each time in order to listen to a digital audio signal having a larger number of channels than the number of channels supported by the owned AV amplifier. In addition, when the user replaces an AV amplifier by purchasing a new one, the previously owned AV amplifier is no longer required, thereby wasting resources.

The present invention has an object to provide an AV amplifier that outputs an audio signal, with which a processing unit for processing a multi-channel digital signal is not required to be provided, and multi-channel audio can be listened to without wasting resources.

Solution to Problem

According to one aspect of the present invention, there is provided an AV amplifier that outputs an audio signal, the AV amplifier including: an input unit configured to input digital data; an operation unit configured to receive a reproduction instruction from a user; a server interface unit configured to transmit the digital data input by the input unit to a server through a network and receive an audio signal from the server; an audio reproduction unit configured to reproduce the audio signal received by the server interface unit; an output unit configured to output the audio signal reproduced by the audio reproduction unit to each speaker; and a control unit configured to control the server interface unit in response to the reproduction instruction from the user, which has been received by the operation unit, wherein the control unit is configured to control, when audio reproduction is instructed by the user, the server interface unit so as to transmit the digital data input by the input unit to the server through the network and to receive a multi-channel audio signal, which has been obtained by processing the digital data by the server, to output the multi-channel audio signal to the audio reproduction unit.

According to one aspect of the present invention, there is provided an AV amplifier that outputs an audio signal, the AV amplifier including: an input unit configured to input digital data; an operation unit configured to receive a reproduction instruction from a user; a switching unit configured to switch whether to output the digital data input by the input unit to a server interface unit or to a DSP in response to the reproduction instruction from the user, which has been received by the operation unit; the DSP configured to process the digital data output by the switching unit to obtain a two-channel signal and output the two-channel signal; the server interface unit configured to transmit the digital data output by the switching unit to a server through a network and receive an audio signal from the server; an audio reproduction unit configured to reproduce the audio signal received by the server interface unit and an audio signal output by the DSP; an output unit configured to output the audio signal reproduced by the audio reproduction unit to each speaker; and a control unit configured to control the switching unit and the server interface unit in response to the reproduction instruction from the user, which has been received by the operation unit, wherein the control unit is configured to: control, when two-channel audio reproduction is instructed from the user, the switching unit so as to output the digital data input by the input unit to the DSP; and control, when multi-channel audio reproduction is instructed from the user, the switching unit so as to output the digital data output from the input unit to the server interface unit, and control the server interface unit so as to transmit the digital data to the server through the network and to receive a multi-channel audio signal, which has been obtained by processing the digital data by the server, to output the multi-channel audio signal to the audio reproduction unit.

According to one aspect of the present invention, the AV amplifier further includes a communication state discrimination unit configured to monitor an input state of the multi-channel audio signal being received from the server by the server interface unit, and the control unit is configured to control the switching unit so as to output, to the DSP, the digital data input to the input unit when the communication state discrimination unit determines that the input state of the multi-channel audio signal being input from the server by the server interface unit has deteriorated while the server interface unit is receiving the multi-channel audio signal from the server.

According to one aspect of the present invention, in the AV amplifier, the control unit is configured to control the switching unit so as to output, to the server interface unit, the digital data input to the input unit when the communication state discrimination unit determines that the input state of the multi-channel audio signal being input from the server by the server interface unit has returned to a satisfactory state after the communication state discrimination unit has determined that the input state of the audio signal being input from the server by the server interface unit has deteriorated and the switching unit has been controlled so as to output, to the DSP, the digital data input to the input unit.

According to one aspect of the present invention, the AV amplifier further includes a buffer unit configured to temporarily store the audio signal reproduced by the audio reproduction unit and output the stored audio signal to the output unit in response to an instruction from the control unit, and the control unit is configured to control, when the multi-channel audio reproduction is to be switched to the two-channel audio reproduction, the buffer unit and the output unit so that the multi-channel audio reproduction is switched to the two-channel audio reproduction while the multi-channel audio signal accumulated in the buffer unit is being output so as to avoid interrupting the output of the audio signal being output from the output unit.

According to one aspect of the present invention, the AV amplifier, further includes a buffer unit configured to temporarily store the audio signal reproduced by the audio reproduction unit and output the stored audio signal to the output unit in response to an instruction from the control unit, and the control unit is configured to control, when the two-channel audio reproduction is to be switched to the multi-channel audio reproduction, the buffer unit and the output unit so that the two-channel audio reproduction is switched to the multi-channel audio reproduction while the two-channel audio signal accumulated in the buffer unit is being output so as to avoid interrupting the output of the audio signal being output from the output unit.

Advantageous Effects of Invention

According to the present invention, it is possible to provide the AV amplifier that outputs an audio signal, with which the processing unit for processing the multi-channel digital signal is not required to be provided, and the multi-channel audio can be listened to without wasting resources.

DESCRIPTION OF EMBODIMENTS

An embodiment of the present invention is described with reference to the drawings.

Figure 1:
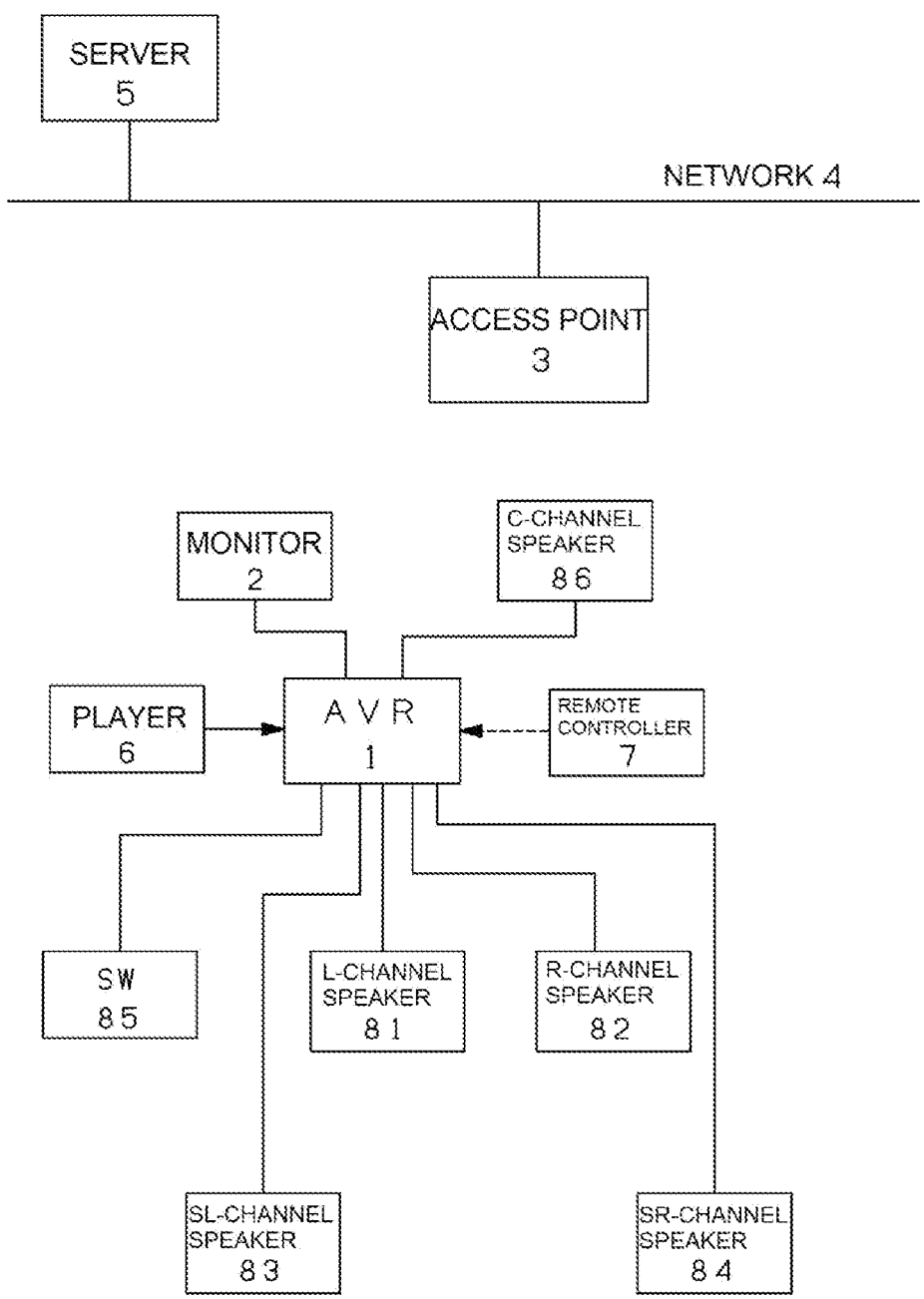
FIG. 1 is a diagram for illustrating a configuration of an AV amplifier according to one embodiment of the present invention.

FIG. 1 is a diagram for illustrating a configuration of an AV amplifier according to one embodiment of the present invention.

As illustrated in FIG. 1, an AV amplifier 1 (hereinafter referred to as "AVR 1") is network-connected to a network 4 through an access point 3, and a server 5 is network-connected to the network 4. The server 5 receives various kinds of data transmitted from the AVR 1 connected thereto through the access point 3 and the network 4, processes the various kinds of data in accordance with instructions from the AV amplifier, and transmits the processed various kinds of data to the AVR 1.

The AVR 1 is connected to a monitor 2 and a player 6. The AVR 1 also receives input of various operation instructions from a remote controller 7 by infrared rays. In addition, the AVR 1 is connected to an L-channel speaker 81 and an R-channel speaker 82 for normal two-channel stereo, and is also connected to an SL-channel speaker 83, an SR-channel speaker 84, a SW 85, and a C-channel speaker 86 for surround sounds.

Figure 2:
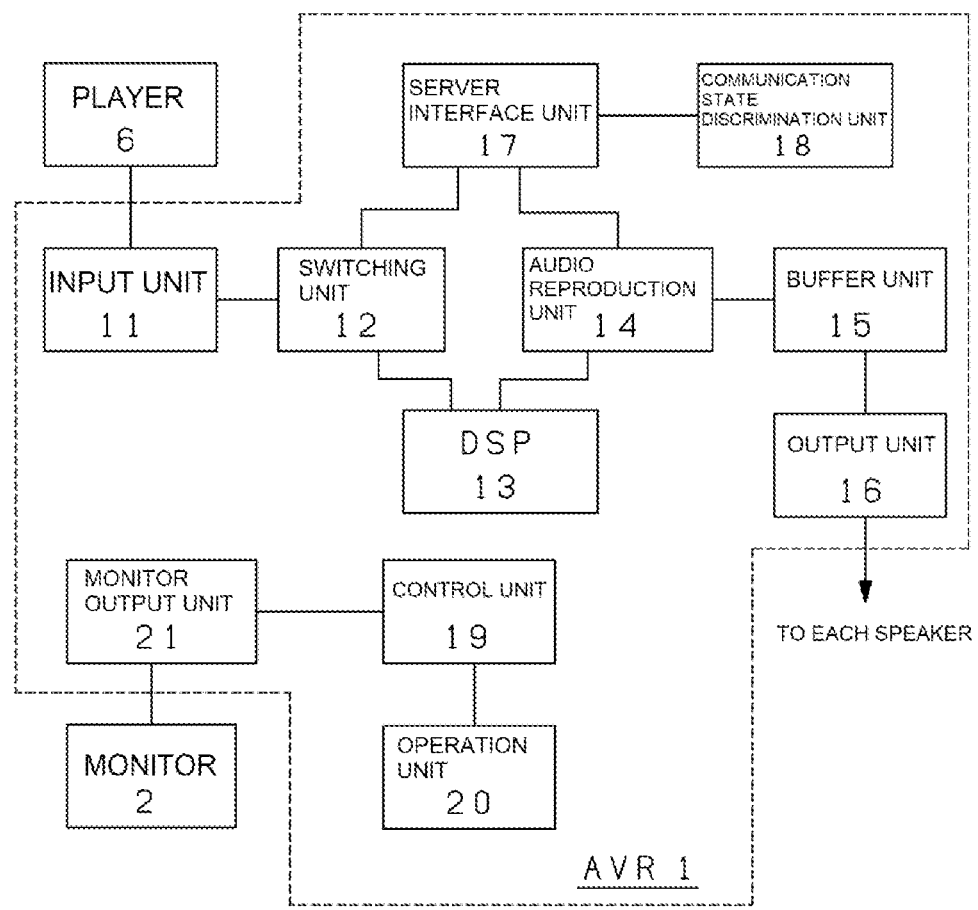
FIG. 2 is a block diagram for illustrating a configuration of an AVR (1) according to this embodiment.

FIG. 2 is a block diagram for illustrating a configuration of the AVR 1 according to this embodiment.

The AVR 1 includes an input unit 11, a switching unit 12, a DSP 13, an audio reproduction unit 14, a buffer unit 15, an output unit 16, a server interface unit 17, a communication state discrimination unit 18, a control unit 19, an operation unit 20, and a monitor output unit 21.

The player 6 reproduces two-channel or multi-channel digital data recorded on a recording medium such as a DVD, and outputs the two-channel or multi-channel digital data to the input unit 11. The input unit 11 inputs the two-channel digital data or multi-channel digital data output from the player 6. The switching unit 12 switches an output destination so that the digital data input by the input unit 11 is output to the server interface unit 17 or the DSP 13 in response to an instruction from the control unit 19, which is described later. The DSP 13 performs signal processing on the two-channel digital data output from the switching unit 12, and outputs the processed two-channel signal to the audio reproduction unit 14. The audio reproduction unit 14 reproduces a multi-channel audio signal input from the server interface unit 17 or a two-channel audio signal input from the DSP 13. The buffer unit 15 temporarily stores the audio signal of a plurality of channels output from the audio reproduction unit 14 under the control of the control unit 19, and outputs the stored audio signal to the output unit 16 at timings of an instruction from the control unit 19. As illustrated in FIG. 1, the output unit 16 is connected to the L-channel speaker 81, the R-channel speaker 82, the SL-channel speaker 83, the SR-channel speaker 84, the SW 85, and the C-channel speaker 86, and outputs the audio signal of each channel output from the buffer unit 15 to each speaker.

The server interface unit 17, which is network-connected to the server 5 through the access point 3 and the network 4 as illustrated in FIG. 1, transmits the multi-channel digital data input from the switching unit 12 to the server 5 under the control of the control unit 19, and also receives an audio signal transmitted from the server 5 to output the audio signal to the audio reproduction unit 14.

The communication state discrimination unit 18 monitors an input state of the audio signal input by the server interface unit 17. The monitor output unit 21 outputs video data to the monitor 2. The operation unit 20 includes operation keys (not shown), and outputs an instruction signal to the control unit 19 in response to an instruction using the operation keys from a user. The operation unit 20 also includes an infrared light receiving unit (not shown), receives an instruction signal based on the infrared rays emitted from the remote controller 7 by the operation of the remote controller 7 from the user to output the instruction signal to the control unit 19. The control unit 19 centrally controls the respective component forming the AVR 1, such as the switching unit 12, the buffer unit 15, the server interface unit 17, and the communication state discrimination unit 18. The monitor 2 displays a video signal output from the monitor output unit 21.

Figure 3:
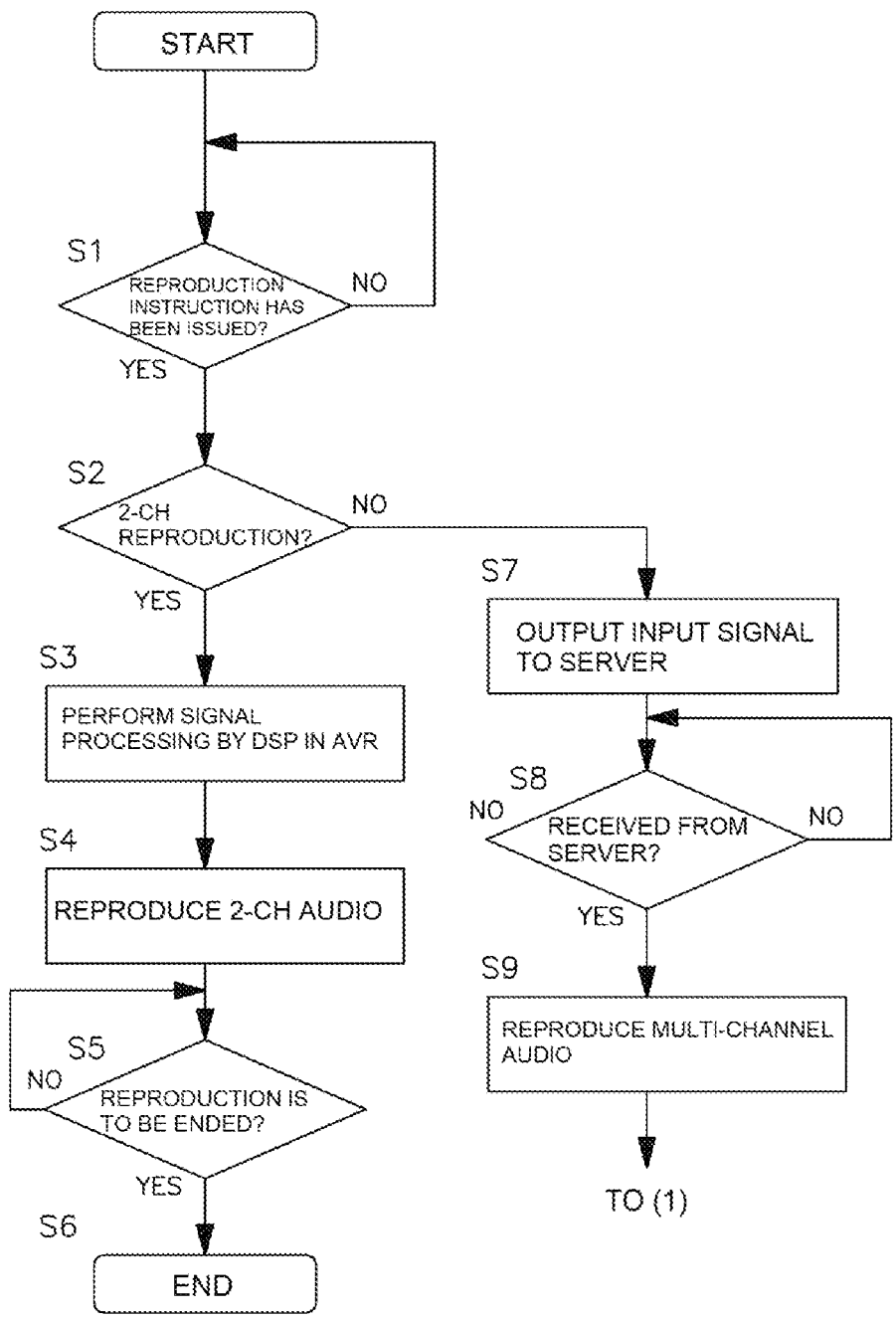
FIG. 3 is a flow chart for illustrating an operation for performing two-channel stereo reproduction or multi-channel reproduction in response to a reproduction instruction from a user in the AVR (1) according to this embodiment.

FIG. 3 is a flow chart for illustrating an operation for performing two-channel stereo reproduction or multi-channel reproduction in response to a reproduction instruction from the user in the AVR 1 according to this embodiment.

The multi-channel reproduction in this embodiment is described by taking a case of performing 5.1-channel multi-channel reproduction.

First, the control unit 19 monitors whether or not a reproduction instruction for a digital signal output from the player 6 has been issued by an operation performed by the user on the operation unit 20 or the remote controller 7 (Step S1), and when the reproduction instruction has been issued, verifies whether the audio signal for which the reproduction instruction has been issued is the two-channel stereo reproduction or the multi-channel reproduction (Step S2). When the two-channel stereo reproduction is instructed in Step S2, the control unit 19 controls the switching unit 12 so as to output, to the DSP 13, the digital data input from the player 6 to the input unit 11. Under the control of the control unit 19, the DSP 13 performs signal processing on the digital data output from the switching unit 12 to obtain a two-channel signal, and outputs the processed two-channel signal to the audio reproduction unit 14 (Step S3). The audio reproduction unit 14 reproduces the two-channel signal output from the DSP 13. The output unit 16 outputs the two-channel signal output from the audio reproduction unit 14 through the buffer unit 15 to each of the L-channel speaker 81 and the R-channel speaker 82. The L-channel speaker 81 and the R-channel speaker 82 each emit sounds of the two-channel signal output from the output unit 16 to perform the stereo reproduction (Step S4). The control unit 19 monitors whether or not an instruction to end the reproduction has been issued by the operation performed by the user on the operation unit 20 (Step S5), and ends the reproduction when the instruction to end the reproduction has been issued (Step S6).

Meanwhile, when the multi-channel reproduction is instructed in Step S2, the control unit 19 controls the switching unit 12 so as to output, to the server interface unit 17, the digital data input from the player 6 to the input unit 11. The server interface unit 17 is network-connected to the server 5 through the access point 3 and the network 4 as illustrated in FIG. 1, and transmits digital data output from the switching unit 12 to the server 5 under the control of the control unit 19 (Step S7). The server 5 stores in advance a program for processing digital data as a 5.1-channel multi-channel signal, and performs signal processing by processing the digital data input from the server interface unit 17 through the access point 3 and the network 4 to obtain a 5.1-channel multi-channel signal. The server 5 outputs the processed 5.1-channel multi-channel signal to the server interface unit 17 through the network 4 and the access point 3. The control unit 19 monitors whether or not the 5.1-channel multi-channel signal processed by the server 5 has been received by the server interface unit 17 (Step S8). When the server interface unit 17 receives the 5.1-channel multi-channel signal, the audio reproduction unit 14 reproduces the 5.1-channel multi-channel signal output from the server interface unit 17. The output unit 16 outputs the 5.1-channel multi-channel signal output from the audio reproduction unit 14 through the buffer unit 15 to each of the L-channel speaker 81, the R-channel speaker 82, the SL-channel speaker 83, the SR-channel speaker 84, the SW 85, and the C-channel speaker 86. Those channel speakers each emit sounds of the multi-channel signal output from the output unit 16 to perform the 5.1-channel multi-channel reproduction (Step S9), and the process advances to the steps of FIG. 4 described later.

Figure 4:
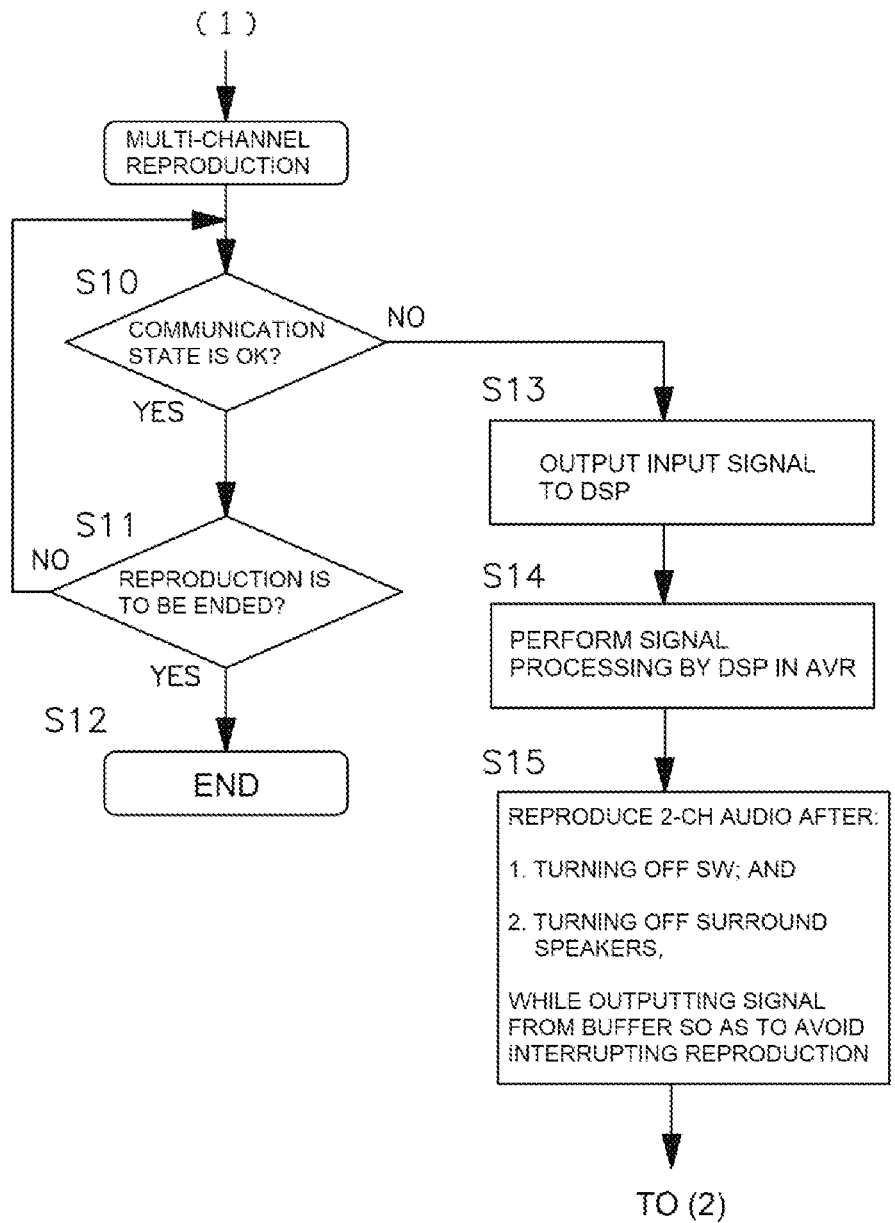
FIG. 4 is a flow chart for illustrating an operation performed while 5.1-channel multi-channel reproduction is being performed in the AVR (1) according to this embodiment.

FIG. 4 is a flow chart for illustrating an operation performed while the 5.1-channel multi-channel reproduction is being performed in the AVR 1 according to this embodiment.

While the 5.1-channel multi-channel reproduction is being performed in Step S9 illustrated in FIG. 3, the control unit 19 controls the communication state discrimination unit 18 as illustrated in FIG. 4 so as to monitor the input state of the audio signal being input from the server 5 to the server interface unit 17 (Step S10). The control unit 19 monitors whether or not an instruction to end the reproduction has been issued by the operation performed by the user on the operation unit 20 (Step S11), and ends the reproduction when the instruction to end the reproduction has been issued (Step S12).

Meanwhile, when it is determined in Step S10 that the input state of the audio signal being input from the server 5 to the server interface unit 17 has deteriorated, the control unit 19 controls the multi-channel signal accumulated in the buffer unit 15 so as to be continuously output to the output unit 16, and controls the switching unit 12 so as to output, to the DSP 13, the digital data input from the player 6 to the input unit 11 (Step S13). Under the control of the control unit 19, the DSP 13 performs signal processing on the digital data output from the switching unit 12 to obtain a two-channel signal, and outputs the processed two-channel signal to the audio reproduction unit 14 (Step S14). The audio reproduction unit 14 reproduces the two-channel signal output from the DSP 13, and outputs the two-channel signal to the buffer unit 15. The control unit 19 controls the buffer unit 15 and the output unit 16 based on a reproducible time of the 5.1-channel multi-channel signal accumulated so far in the buffer unit 15 so that the two-channel signal is output to each of the L-channel speaker 81 and the R-channel speaker 82 after first turning off the output of the multi-channel signal to the SW 85 and then turning off the output of the multi-channel signal to the SL-channel speaker 83, the SR-channel speaker 84, and the C-channel speaker 86 while the multi-channel signal is being output from the buffer unit 15 so as to avoid interrupting the output of the multi-channel signal being output from the output unit 16. The L-channel speaker 81 and the R-channel speaker 82 each emit the sounds of the two-channel signal output from the output unit 16, to thereby perform the stereo reproduction (Step S15), and the process advances to the steps of FIG. 5 described later.

Figure 5:
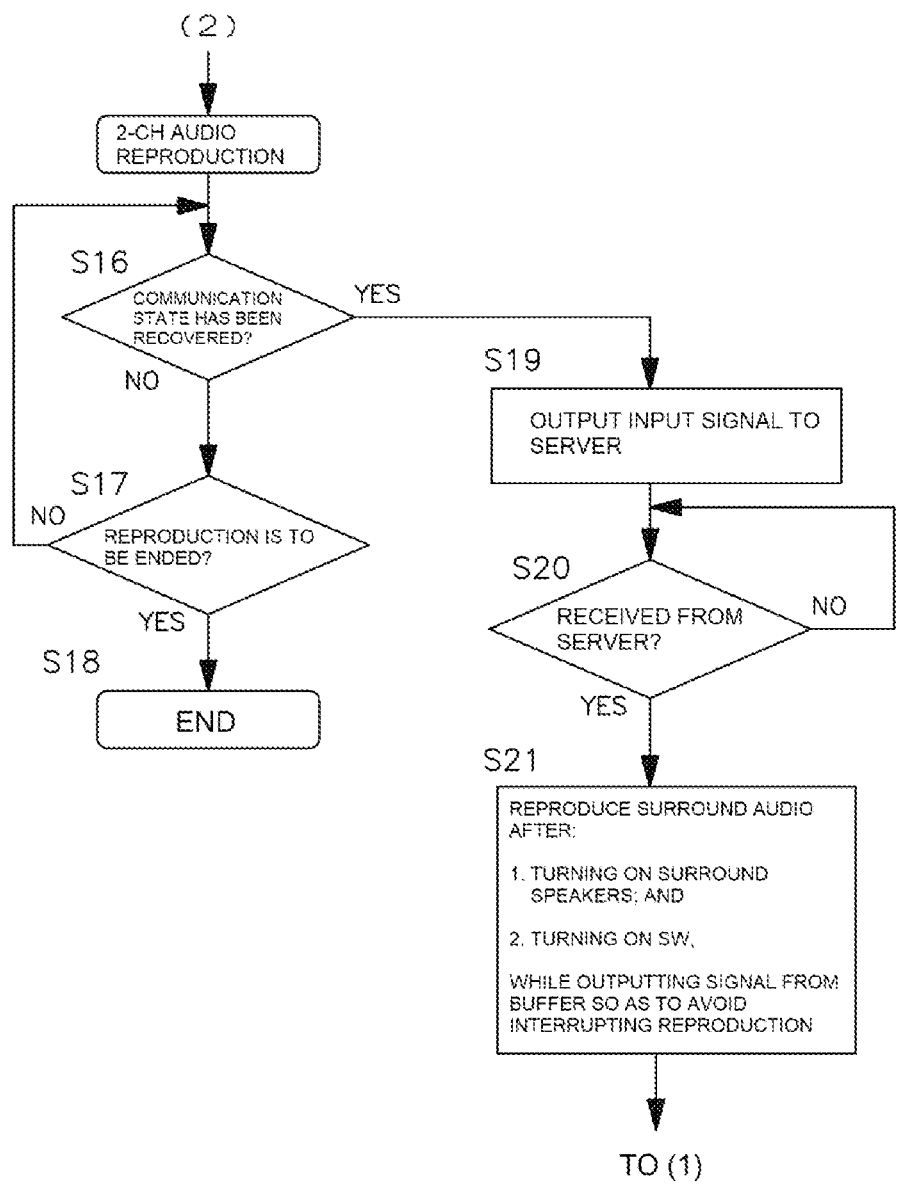
FIG. 5 is a flow chart for illustrating an operation performed while the two-channel stereo reproduction is being performed due to deterioration of a transmission state from a server (5) during the 5.1-channel multi-channel reproduction performed as illustrated in FIG. 4 in the AVR (1) according to this embodiment.

FIG. 5 is a flow chart for illustrating an operation performed while the two-channel stereo reproduction is being performed due to deterioration of a transmission state from the server 5 during the 5.1-channel multi-channel reproduction performed as illustrated in FIG. 4 in the AVR 1 according to this embodiment.

While the two-channel stereo reproduction is being performed due to the deterioration of the transmission state from the server 5 during the 5.1-channel multi-channel reproduction performed in Step S15 illustrated in FIG. 4, the control unit 19 controls the communication state discrimination unit 18 as illustrated in FIG. 5 so as to monitor the input state of the audio signal being input from the server 5 to the server interface unit 17 to monitor whether or not the input state of the audio signal has returned to a satisfactory state (Step S16). The control unit 19 monitors whether or not an instruction to end the reproduction has been issued by the operation performed by the user on the operation unit 20 (Step S17), and ends the reproduction when the instruction to end the reproduction has been issued (Step S18).

Meanwhile, when it is determined in Step S16 that the input state of the audio signal being input from the server 5 to the server interface unit 17 has returned to a satisfactory state, the control unit 19 controls the two-channel signal accumulated in the buffer unit 15 so as to be continuously output to the output unit 16, and controls the switching unit 12 so as to output, to the server interface unit 17, the digital data input from the player 6 to the input unit 11. The server interface unit 17 is network-connected to the server 5 through the access point 3 and the network 4 as illustrated in FIG. 1, and transmits digital data output from the switching unit 12 to the server 5 under the control of the control unit 19 (Step S19). The server 5 performs signal processing by processing the digital data input from the server interface unit 17 through the access point 3 and the network 4 to obtain a 5.1-channel multi-channel signal. The server 5 outputs the processed 5.1-channel multi-channel signal to the server interface unit 17 through the network 4 and the access point 3. The control unit 19 monitors whether or not the 5.1-channel multi-channel signal processed by the server 5 has been received by the server interface unit 17 (Step S20). When the server interface unit 17 receives the 5.1-channel multi-channel signal, the audio reproduction unit 14 reproduces the 5.1-channel multi-channel signal output from the server interface unit 17 to output the 5.1-channel multi-channel signal to the buffer unit 15. The control unit 19 controls the buffer unit 15 and the output unit 16 based on a reproducible time of the two-channel signal accumulated so far in the buffer unit 15 so that the multi-channel signal is output to each of the L-channel speaker 81, the R-channel speaker 82, the SL-channel speaker 83, the SR-channel speaker 84, the SW 85, and the C-channel speaker 86 after first turning on the output of the multi-channel signal to the SL-channel speaker 83, the SR-channel speaker 84, and the C-channel speaker 86 and then turning on the output of the multi-channel signal to the SW 85 while the two-channel signal is being output from the buffer unit 15 so as to avoid interrupting the output of the two-channel signal being output from the output unit 16. The L-channel speaker 81, the R-channel speaker 82, the SL-channel speaker 83, the SR-channel speaker 84, the SW 85, and the C-channel speaker 86 each emit the sounds of the multi-channel signal output from the output unit 16, to thereby perform multi-channel surround audio reproduction (Step S21), and the process returns to the steps of FIG. 4 described above.

As described above, in the AVR 1 according to this embodiment, when the two-channel stereo reproduction is instructed from the user, the switching unit 12 outputs the digital data output from the player 6 to the DSP 13, and the DSP 13 provided in the AVR 1 performs signal processing on the digital data to obtain a two-channel signal and outputs the processed two-channel signal to the audio reproduction unit 14, to thereby be able to perform the two-channel stereo reproduction. Meanwhile, when the multi-channel reproduction is instructed from the user, the switching unit 12 outputs the digital data output from the player 6 to the server interface unit 17, the server interface unit 17 transmits the digital data to the server 5 through the access point 3 and the network 4, and the server 5 performs signal processing on the digital data to obtain a multi-channel signal and outputs the processed multi-channel signal to the audio reproduction unit 14 through the network 4, the access point 3, and the server interface unit 17, to thereby be able to perform the multi-channel reproduction.

In this manner, in the AVR 1 according to this embodiment, when the two-channel reproduction is instructed from the user, the DSP 13 provided in the AVR 1 performs the signal processing for a two-channel signal, and when the multi-channel reproduction is instructed from the user, the digital signal is transmitted to the server 5 and subjected to the signal processing for a multi-channel signal by the server 5. Thus, even when a processing unit for processing a multi-channel digital signal, such as a 5.1-channel digital signal, is not provided in the AVR 1, the two-channel reproduction or the multi-channel reproduction can be performed in response to an instruction from the user. As described above, the AVR 1 according to this embodiment is not required to be provided with a processing unit for processing a multi-channel digital signal, and hence it is possible to reduce a manufacturing cost of the AVR 1.

The AVR 1 according to this embodiment has been described by taking the case of performing the 5.1-channel multi-channel reproduction as the case of performing the multi-channel reproduction. However, a program for processing various kinds of multi-channel digital data can be stored in advance in the server 5 in order to support not only 5.1 channels but also, for example, multi-channel reproduction for 7.1 channels obtained by adding a surround back left channel and a surround back right channel to the 5.1 channels, 13.1-channel reproduction, and 24.1.10-channel multi-channel reproduction. In this case, it is required to provide an output terminal for outputting an audio signal from the output unit 16 to as many speakers as a number exceeding 5.1 channels. However, the AV amplifier can be provided with, for example, as many output terminals as a number exceeding 5.1 channels as spare terminals in advance, and when multi-channel reproduction for the number of channels exceeding 5.1 channels is to be performed, the above-mentioned spare terminals can be used to perform, for example, the multi-channel reproduction for the number of channels exceeding 5.1 channels.

Thus, even when the number of channels for multi-channel reproduction increases in the future, it is not required to replace the AVR 1 according to this embodiment by purchasing an AV amplifier provided with a DSP that supports the number of newly added channels. Therefore, the user can listen to multi-channel audio of the number of desired channels without wasting the AV amplifier used so far.

Further, in the AVR 1 according to this embodiment, while the multi-channel reproduction is being performed, the control unit 19 controls the communication state discrimination unit 18 so as to monitor the input state of the audio signal being input from the server 5, and when it is determined that the input state has deteriorated, the control unit 19 controls the switching unit 12 so as to output, to the DSP 13, the digital data input to the input unit 11, and controls the DSP 13 so as to perform the signal processing on the digital data to obtain a two-channel signal and to output the processed two-channel signal to the audio reproduction unit 14. Thus, even when a state of communication to/from the server 5 for processing the digital data to obtain a multi-channel signal has deteriorated to interrupt the reception of the multi-channel signal from the server 5, it is possible to prevent audio reproduction from being interrupted at some midpoint by automatically switching the multi-channel reproduction based on the processing of the server 5 to the two-channel reproduction based on the processing of the DSP 13 in the AVR 1.

Further, in the AVR 1 according to this embodiment, when the multi-channel reproduction is to be switched to the two-channel reproduction due to the deterioration of the input state of the audio signal from the server 5, the control unit 19 controls the buffer unit 15 and the output unit 16 based on the reproducible time of the multi-channel signal accumulated so far in the buffer unit 15 so that the two-channel signal is output to each of the L-channel speaker 81 and the R-channel speaker 82 after first turning off the output of the multi-channel signal to the SW 85 and then turning off the output of the multi-channel signal to the SL-channel speaker 83, the SR-channel speaker 84, and the C-channel speaker 86 while the multi-channel signal is being output from the buffer unit 15 so as to avoid interrupting the output of the multi-channel signal being output from the output unit 16. Thus, when the multi-channel reproduction is to be switched to the two-channel reproduction due to the deterioration of the input state of the audio signal from the server 5, it is possible to smoothly switch the multi-channel reproduction to the two-channel stereo reproduction without providing a sense of discomfort to the user listening to the audio.

Further, in the AVR 1 according to this embodiment, while the two-channel stereo reproduction is being performed due to the deterioration of the transmission state from the server 5 during the multi-channel reproduction, the control unit 19 controls the communication state discrimination unit 18 so as to monitor whether or not the input state of the audio signal being input from the server 5 has returned to a satisfactory state, and when it is determined that the input state of the audio signal being input from the server 5 has returned to a satisfactory state, the control unit 19 controls the switching unit 12 so as to output, to the server interface unit 17, the digital data input to the input unit 11. Then, the server interface unit 17 transmits the digital data to the server 5 through the access point 3 and the network 4, and the server 5 performs the signal processing on the digital data to obtain a multi-channel signal and outputs the processed multi-channel signal to the audio reproduction unit 14 through the network 4, the access point 3, and the server interface unit 17. Thus, while the two-channel stereo reproduction is being performed due to the deterioration of the transmission state from the server 5 during the multi-channel reproduction, when the input state of the audio signal from the server 5 has returned to a satisfactory state, it is possible to restart the multi-channel reproduction, which is initially desired by the user, by automatically switching the two-channel reproduction based on the processing of the DSP 13 in the AVR 1 back to the multi-channel reproduction based on the processing of the server 5.

Further, in the AVR 1 according to this embodiment, after the multi-channel reproduction is switched to the two-channel reproduction due to the deterioration of the input state of the audio signal from the server 5, when the input state of the audio signal being input from the server 5 has returned to a satisfactory state and the previous multi-channel reproduction is to be switched back, the control unit 19 controls the buffer unit 15 and the output unit 16 based on the reproducible time of the two-channel signal accumulated so far in the buffer unit 15 so that the multi-channel signal is output to each of the L-channel speaker 81, the R-channel speaker 82, the SL-channel speaker 83, the SR-channel speaker 84, the SW 85, and the C-channel speaker 86 after first turning on the output of the multi-channel signal to the SL-channel speaker 83, the SR-channel speaker 84, and the C-channel speaker 86 and then turning on the output of the multi-channel signal to the SW 85 while the two-channel signal is being output from the buffer unit 15 so as to avoid interrupting the output of the two-channel signal being output from the output unit 16. Thus, it is possible to smoothly switch the two-channel stereo reproduction to the multi-channel reproduction without providing a sense of discomfort to the user listening to the audio.

The AVR 1 according to this embodiment is configured so that, when the user desires the two-channel stereo reproduction, the DSP 13 provided in the AVR 1 processes the digital data to obtain a two-channel signal, but may be configured so that the digital data output from the player 6 is always transmitted to the server 5 and the server 5 performs the signal processing on the two-channel signal and the multi-channel signal. Thus, the AVR 1 is not required to be provided with the DSP 13, and hence it is possible to further reduce the manufacturing cost of the AVR 1.

The AVR 1 according to this embodiment is configured to be network-connected to the server 5 through the access point 3 and the network 4, but another connection configuration may be employed as long as connection to another media server or another device is possible.

The AVR 1 according to this embodiment is configured to receive the input of the digital data from the player 6, but may be configured so that, for example, digital data stored in a server on a network is received by a network interface such as the server interface unit 17 and the DSP 13 or the server 5 performs the signal processing on the received digital data.

The AVR 1 according to this embodiment is configured so that the output unit 16 outputs the audio signal to each of the speakers, but may be configured so that, when the speakers are, for example, network speakers or speakers compatible with short-range wireless communication such as Bluetooth (trademark), the audio data is transmitted to each of the speakers from a network interface such as the server interface unit 17 or from a Bluetooth (trademark) interface.

INDUSTRIAL APPLICABILITY

The present invention can be usefully used as an AV amplifier that outputs a two-channel or multi-channel audio signal.

REFERENCE SIGNS LIST

1 AVR, 2 monitor, 3 access point, 4 network, 5 server, 6 player, 7 remote controller, 81 L-channel speaker, 82 R-channel speaker, 83 SL-channel speaker, 84 SR-channel speaker, 85 SW, 86 C-channel speaker, 11 input unit, 12 switching unit, 13 DSP, 14 audio reproduction unit, 15 buffer unit, 16 output unit, 17 server interface unit, 18 communication state discrimination unit, 19 control unit, 20 operation unit

The invention claimed is:

1. An AV amplifier that outputs an audio signal, the AV amplifier comprising:
an input unit configured to input digital data;
an operation unit configured to receive a reproduction instruction from a user;
a switching unit configured to switch whether to output the digital data input by the input unit to a server interface unit or to a Digital Signal Processor (DSP) in response to the reproduction instruction from the user, which has been received by the operation unit;
the DSP configured to process the digital data output by the switching unit to obtain a two-channel signal and output the processed two-channel signal;
the server interface unit configured to transmit the digital data output by the switching unit to a server through a network and receive a multi-channel audio signal from the server;
an audio reproduction unit configured to reproduce the multi-channel audio signal received by the server interface unit or processed two-channel audio signal output by the DSP;
an output unit configured to output the audio signal reproduced by the audio reproduction unit to each speaker, wherein the audio signal is either the multi-channel audio signal or the processed two-channel audio signal; and
a control unit configured to control the switching unit and the server interface unit in response to the reproduction instruction from the user, which has been received by the operation unit,
wherein the control unit is configured to:
control, when two-channel audio reproduction is instructed from the user, the switching unit so as to output the digital data input by the input unit to the DSP; and
control, when multi-channel audio reproduction is instructed from the user, the switching unit so as to output the digital data output from the input unit to the server interface unit, and control the server interface unit so as to transmit the digital data to the server through the network and to receive the multi-channel audio signal, which has been obtained by processing the digital data by the server, to output the multi-channel audio signal to the audio reproduction unit.

2. The AV amplifier according to claim 1, further comprising a communication state discrimination unit configured to monitor an input state of the multi-channel audio signal being received from the server by the server interface unit,
wherein the control unit is configured to control the switching unit so as to output, to the DSP, the digital data input to the input unit when the communication state discrimination unit determines that the input state of the multi-channel audio signal being input from the server by the server interface unit has deteriorated while the server interface unit is receiving the multi-channel audio signal from the server.

3. The AV amplifier according to claim 2, further comprising a buffer unit configured to temporarily store the audio signal reproduced by the audio reproduction unit and output the stored audio signal to the output unit in response to an instruction from the control unit,
wherein the control unit is configured to control, when the multi-channel audio reproduction is to be switched to the two-channel audio reproduction, the buffer unit and the output unit so that the multi-channel audio reproduction is switched to the two-channel audio reproduction while the multi-channel audio signal accumulated in the buffer unit is being output so as to avoid interrupting the output of the audio signal being output from the output unit.

4. The AV amplifier according to claim 2, wherein the control unit is configured to control the switching unit so as to output, to the server interface unit, the digital data input to the input unit when the communication state discrimination unit determines that the input state of the multi-channel audio signal being input from the server by the server interface unit has returned to a satisfactory state after the communication state discrimination unit has determined that the input state of the audio signal being input from the server by the server interface unit has deteriorated and the switching unit has been controlled so as to output, to the DSP, the digital data input to the input unit.

5. The AV amplifier according to claim 4, further comprising a buffer unit configured to temporarily store the audio signal reproduced by the audio reproduction unit and output the stored audio signal to the output unit in response to an instruction from the control unit,
wherein the control unit is configured to control, when the two-channel audio reproduction is to be switched to the multi-channel audio reproduction, the buffer unit and the output unit so that the two-channel audio reproduction is switched to the multi-channel audio reproduction while the two-channel audio signal accumulated in the buffer unit is being output so as to avoid interrupting the output of the audio signal being output from the output unit.

6. The AV amplifier according to claim 1, further comprising a monitor output unit for outputting video data to a monitor.

7. The AV amplifier according to claim 1, wherein each speaker includes at least a L-channel speaker and a R-channel speaker.

8. The AV amplifier according to claim 1, wherein the operation unit is configured to receive an end reproduction instruction.

9. The AV amplifier according to claim 8, wherein the control unit monitors whether or not the end reproduction instruction has been received by the operation unit.

10. The AV amplifier according to claim 1, wherein the server stores in advance a program for processing digital data as a specific channel number, multi-channel signal.

11. The AV amplifier according to claim 1, wherein each speaker is a network speaker, and wherein the audio signal is transmitted to each speaker from the server interface unit.

12. The AV amplifier according to claim 1, wherein each speaker is compatible with short-range wireless communication, and wherein the audio signal is transmitted to each speaker from the server interface unit.

* * * * *